(12) United States Patent
Hashemi et al.

(10) Patent No.: US 11,515,430 B2
(45) Date of Patent: Nov. 29, 2022

(54) TILTED NANOWIRE TRANSISTOR

(71) Applicant: International Business Machines Corporation, Armonk, NY (US)

(72) Inventors: Pouya Hashemi, Purchase, NY (US); Kangguo Cheng, Schenectady, NY (US); Alexander Reznicek, Troy, NY (US); Karthik Balakrishnan, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 16/814,196

(22) Filed: Mar. 10, 2020

(65) Prior Publication Data

US 2020/0212228 A1 Jul. 2, 2020

Related U.S. Application Data

(62) Division of application No. 15/660,610, filed on Jul. 26, 2017, now Pat. No. 10,622,486.

(51) Int. Cl.
*H01L 29/786* (2006.01)
*H01L 29/08* (2006.01)
(Continued)

(52) U.S. Cl.
CPC .... *H01L 29/78696* (2013.01); *H01L 21/0243* (2013.01); *H01L 21/0245* (2013.01); *H01L 21/02381* (2013.01); *H01L 21/02433* (2013.01); *H01L 21/02494* (2013.01); *H01L 21/02502* (2013.01); *H01L 21/02516* (2013.01); *H01L 21/02532* (2013.01); *H01L 21/02603* (2013.01); *H01L 29/0669* (2013.01); *H01L 29/0847* (2013.01); *H01L 29/1037* (2013.01); *H01L 29/42376* (2013.01); *H01L 29/42392* (2013.01);
(Continued)

(58) Field of Classification Search
CPC ....... H01L 21/02381-02603; H01L 29/78696; H01L 29/0669-068; Y10S 977/762
See application file for complete search history.

(56) References Cited

U.S. PATENT DOCUMENTS

| 2015/0061013 A1* | 3/2015 | Basu | H01L 29/1054 |
| | | | 438/299 |
| 2015/0318303 A1* | 11/2015 | Basu | H01L 29/66545 |
| | | | 257/350 |

(Continued)

OTHER PUBLICATIONS

Veloso, et al., "Juntionless Gate-All-Around Lateral and Vertical Nanowire FETs with Simplified Processing for Advanced Logic and Analog/RF Applications and Scaled SRAM Cells", 2016 Symposium on VLSI Technology Digest of Technology Papers, Date of Conference: Jun. 14-16, 2016, pp. 138-139.

(Continued)

*Primary Examiner* — Eric K Ashbahian
(74) *Attorney, Agent, or Firm* — Scully, Scott, Murphy & Presser, P.C.; L. Jeffrey Kelly, Esq.

(57) ABSTRACT

A tilted nanowire structure is provided which has an increased gate length as compared with a horizontally oriented semiconductor nanowire at the same pitch. Such a structure avoids complexity required for vertical transistors and can be fabricated on a bulk semiconductor substrate without significantly changing/modifying standard transistor fabrication processing.

14 Claims, 17 Drawing Sheets

(51) Int. Cl.
   *H01L 29/06*    (2006.01)
   *H01L 29/423*   (2006.01)
   *H01L 21/02*    (2006.01)
   *H01L 29/66*    (2006.01)
   *H01L 29/10*    (2006.01)

(52) U.S. Cl.
   CPC .. *H01L 29/66545* (2013.01); *H01L 29/66636* (2013.01); *H01L 29/66659* (2013.01); *H01L 29/66742* (2013.01); *H01L 29/78603* (2013.01); *H01L 21/02499* (2013.01); *H01L 29/78642* (2013.01)

(56) References Cited

U.S. PATENT DOCUMENTS

| | | | |
|---|---|---|---|
| 2016/0204276 A1* | 7/2016 | Dasgupta | H01L 29/775 438/150 |
| 2017/0263722 A1* | 9/2017 | You | H01L 29/775 |
| 2018/0151669 A1* | 5/2018 | Van Dal | H01L 29/7854 |

OTHER PUBLICATIONS

Bansaruntip, et al., "High Performance and Highly Uniform Gate-All-Around Silicon Nanowire MOSFETs with Wire Size Dependent Scaling", Electron Devices Meeting (IEDM), IEEE, Dec. 2009, pp. 12.1.3 to 12.3.4.

List of IBM Patents or Patent Applications Treated as Related, dated Mar. 10, 2020, 2 pages.

\* cited by examiner

TILTED NANOWIRE TRANSISTOR

BACKGROUND

The present application relates to a semiconductor structure and a method of forming the same. More particularly, the present application relates to a semiconductor structure including at least one tilted semiconductor nanowire which can provide a longer gate length than a horizontal semiconductor nanowire at a same gate pitch. The present application also relates to a method of providing such a tilted semiconductor nanowire structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor nanowire field effect transistors (FETs) is the next step in the evolution of complementary metal oxide semiconductor (CMOS) devices. Semiconductor nanowire field effect transistors (FETs) can achieve higher drive currents with increasingly smaller dimensions as compared to conventional planar FETs. In its basic form, a semiconductor nanowire FET includes a source, a drain and one or more nanowire channels between the source and the drain. A gate electrode, which contacts the one or more nanowire channels, regulates electron flow through the nanowire channel between the source and drain. Semiconductor nanowires that are oriented vertically or horizontally relative to an underlying substrate are known.

Scaling the gate length in aggressively scaled contacted gate pitch is challenging for 5 nm and beyond technologies, since there is not much room left for the gate length. Nanowire width scaling results in considerable mobility reduction, and an access resistance increase, which are not very desirable.

There is thus a need to provide a semiconductor nanowire structure that has a longer gate length than horizontally oriented semiconductor nanowires at the same pitch.

SUMMARY

A tilted nanowire structure is provided which has an increased gate length as compared with a horizontally oriented semiconductor nanowire at the same pitch. Such a structure avoids complexity required for vertical transistors and can be fabricated on a bulk semiconductor substrate without significantly changing/modifying standard transistor fabrication processing.

In one aspect of the present application, a semiconductor structure is provided. In one embodiment, the semiconductor structure includes a bulk semiconductor substrate having an entirely planar topmost surface. A first semiconductor material layer comprising a first semiconductor material is located on the entirely planar topmost surface of the bulk semiconductor substrate. A second semiconductor material layer is located on the first semiconductor material layer, wherein the second semiconductor material layer has a faceted surface and comprises a second semiconductor material having a different etch selectivity than the first semiconductor material. A tilted semiconductor nanowire is located on a portion of the faceted surface of the second semiconductor material layer, and a functional gate structure is located above the tilted semiconductor nanowire.

In another embodiment, the semiconductor structure includes a bulk semiconductor substrate having an entirely planar topmost surface. A first semiconductor material layer comprising a first semiconductor material and having a faceted surface is located on the entirely planar topmost surface of the bulk semiconductor substrate. A second semiconductor material layer is located on portions of the first semiconductor material layer, wherein the second semiconductor material layer comprises a second semiconductor material having a different etch selectivity than the first semiconductor material. A tilted semiconductor nanowire is suspended above a portion of the faceted surface of the first semiconductor material layer, and a functional gate structure is located above and beneath the tilted semiconductor nanowire.

In another aspect of the present application, a method of forming a semiconductor structure is provided. In one embodiment, the method includes providing a material stack of, from bottom to top, a bulk semiconductor substrate, a first semiconductor material layer comprising a first semiconductor material, and a second semiconductor material layer comprising a second semiconductor material that has a different etch selectivity than the first semiconductor material, and wherein at least the second semiconductor material layer has a faceted surface. Next, a semiconductor channel material layer is formed on the second semiconductor material layer. A sacrificial gate structure is then formed on a portion of the semiconductor channel material layer that is present on the faceted surface of second semiconductor material layer, wherein a dielectric spacer is present on sidewall surfaces of the sacrificial gate structure and wherein a portion of the semiconductor channel material layer protected by the dielectric spacer and the sacrificial gate structure defines a tilted semiconductor nanowire. Next, source/drain structures are formed extending from opposing ends of the tilted semiconductor nanowire, and thereafter an inter-level dielectric material is formed atop the source/drain structures and surrounding the sacrificial gate structure. The sacrificial gate structure is then replaced with a functional gate structure.

DETAILED DESCRIPTION

Figure 1A:
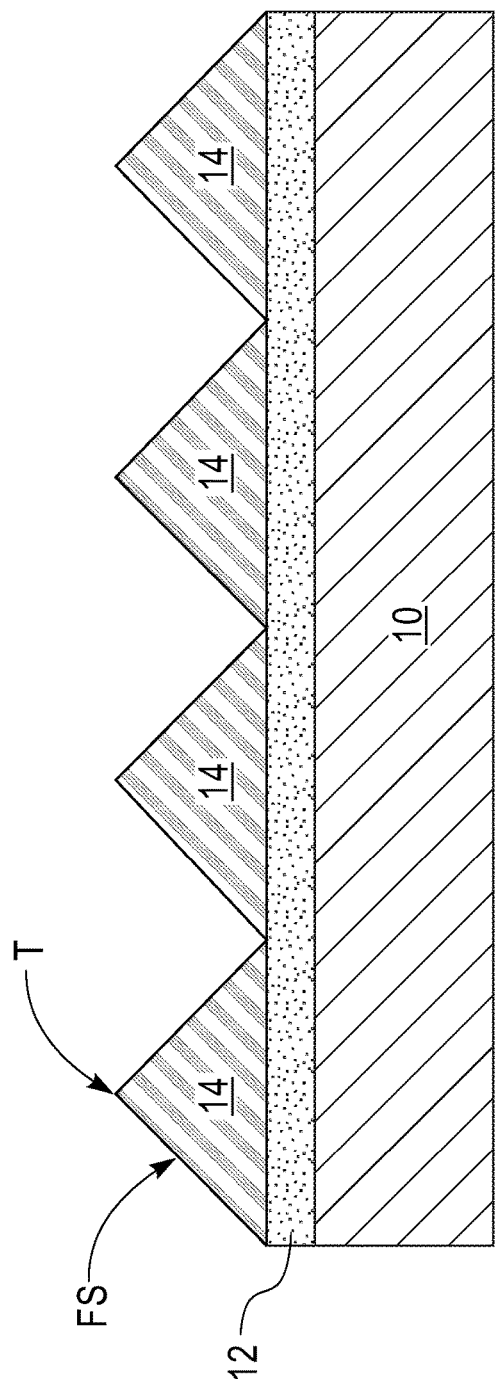
FIG. 1A is a cross sectional view of an exemplary semiconductor structure including a bulk semiconductor substrate, a first semiconductor material layer, and a second semiconductor material layer that has a faceted surface and a different etch selectivity than the first semiconductor material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
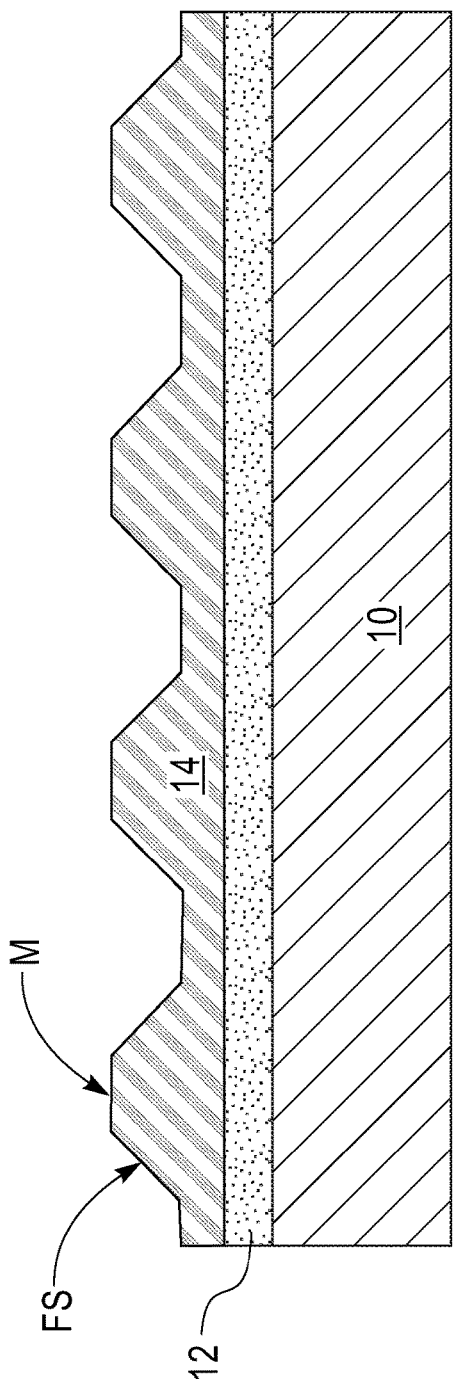
FIG. 1B is a cross sectional view of an exemplary semiconductor structure including a bulk semiconductor substrate, a first semiconductor material layer, and a second semiconductor material layer that has a faceted surface and a different etch selectivity than the first semiconductor material layer that can be employed in accordance with another embodiment of the present application.

Referring first to FIGS. 1A-1B, there are illustrated various exemplary semiconductor structures that can be employed in accordance with an embodiment of the present application. Each of the exemplary structures shown in FIGS. 1A-1B includes a bulk semiconductor substrate 10, a first semiconductor material layer 12 located on a topmost surface of the bulk semiconductor substrate 10, and a second semiconductor material layer 14 located on the first semiconductor material layer 12. In accordance with this embodiment, the second semiconductor material layer 14 has a faceted surface, FS, and a different etch selectivity than the first semiconductor material layer 12. By "faceted surface" it is meant a non-planar surface of a material. In this embodiment of the present application, the bulk semiconductor substrate 10 has an entirely planar topmost surface, and the first semiconductor material layer 12 also has an entirely planar topmost surface.

As stated above, the exemplary structures of FIGS. 1A and 1B include a bulk semiconductor substrate 10. By "bulk" it is meant that the semiconductor substrate 10 is entirely composed of at least one semiconductor material having semiconducting properties. Examples of semiconductor materials that may provide the bulk semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the bulk semiconductor substrate 10 may be entirely composed of silicon. In some embodiments, the bulk semiconductor substrate 10 may include a multilayered semiconductor material stack including at least two different semiconductor materials, as defined above. In one example, the multilayered semiconductor material stack may comprise, in any order, a stack of Si and a silicon germanium alloy.

The semiconductor material that provides the bulk semiconductor substrate 10 may be a single crystalline semiconductor material. The semiconductor material that provides the bulk semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

The first semiconductor material layer 12 that is present on the topmost surface of the bulk semiconductor substrate 10 comprises a first semiconductor material which can be typically doped with either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In one embodiment, the first semiconductor material that provides the first semiconductor material layer 12 may be composed of a same semiconductor material as the bulk semiconductor substrate 10. In one example, the bulk semiconductor substrate 10 and the first semiconductor material that provides the first semiconductor material layer 12 may be both composed of silicon. In another embodiment, the first semiconductor material that provides the first semiconductor material layer 12 may be compose of a different semiconductor material than the bulk semiconductor substrate 10. In one example, the bulk semiconductor substrate 10 may be composed of a silicon germanium alloy and the first semiconductor material that provides the first semiconductor material layer 12 may be composed of silicon.

In one embodiment, the concentration of n-type or p-type dopant within the first semiconductor material that provides the first semiconductor material layer 12 can range from $5 \times 10^{18}$ atoms/cm$^3$ to $5 \times 10^{19}$ atoms/cm$^3$, although dopant concentrations greater than $5 \times 10^{19}$ atoms/cm$^3$ or less than $5 \times 10^{18}$ atoms/cm$^3$ can also be employed as the dopant concentration of the first semiconductor material layer 12. In one embodiment, the doping within the first semiconductor material layer 12 may be uniform (i.e., have a uniform distribution of dopants throughout the entire region). In another embodiment, the doping within the first semiconductor material layer 12 may be graded. In some embodiments, the first semiconductor material layer 12 can serve as a punch through stop layer.

In one embodiment of the present application, the first semiconductor material layer 12 may have a thickness from 50 nm to 200 nm. Other thicknesses that are lesser than, or greater than, the aforementioned thickness range may also be employed in the present application as the thickness of the first semiconductor material layer 12.

In one embodiment, the first semiconductor material layer 12 can be formed by introducing an n-type or p-type dopant within an upper portion of a bulk semiconductor substrate 10. In another embodiment, the first semiconductor material layer 12 may be formed utilizing an epitaxial growth process in which an appropriate dopant can be introduced during the epitaxial growth process or after epitaxial growth of an intrinsic semiconductor material.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In embodiments in which an epitaxial growth process is used in providing the first semiconductor material layer 12, the first semiconductor material layer 12 has an epitaxial relationship with the exposed semiconductor material surface of the bulk semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 500° C. to 900° C. Although higher temperature typically results in faster deposition, the faster deposition may result in crystal defects and film cracking. The epitaxial growth of the first semiconductor material layer 12 can be performed utilizing any well known precursor gas or gas mixture. Carrier gases like hydrogen, nitrogen, helium and argon can be used. In some embodiments, an n-type or p-type dopant can be present in the precursor gas or gas mixture used to provide the first semiconductor material layer 12. In other embodiments, an n-type or p-type dopant can be introduced after epitaxial growth of an non-doped first semiconductor material utilizing well known processes such as, for example, gas phase doping or ion implantation.

The second semiconductor material layer 14 that is present on the topmost surface of the first semiconductor material layer 12 comprises a second semiconductor material which can be typically doped with the same conductivity type dopant as the first semiconductor material layer 12; the dopant concentration of dopant in the second semiconductor material layer 14 is within the dopant concentration range mentioned above for the first semiconductor material layer 12. The second semiconductor material that provides the second semiconductor material layer 14 is a different semiconductor material than the first semiconductor material that provides the first semiconductor material layer 12. In one example, the first semiconductor material that provides the first semiconductor material layer 12 may be composed of silicon, while the second semiconductor material that provides the second semiconductor material layer 14 may be composed of a silicon germanium alloy. In some embodiments, the second semiconductor layer 14 may also function as a punch through stop layer.

As mentioned above, the second semiconductor material layer 14 has a faceted surface, FS. In FIG. 1A, the second semiconductor material layer 14 is pyramidal in shape having faceted sidewalls, FS, that converge at tip, T. In FIG. 1B, the second semiconductor material layer 14 is also pyramidal in shape having faceted sidewalls, FS, and a mesa surface, M.

The second semiconductor material layer 14 can be formed by epitaxial growth. In some embodiments, the epitaxial growth is a faceted epitaxial growth process in which faceted surfaces form without performing any post epitaxial growth patterning process. In another embodiment, the epitaxial growth is a non-faceted epitaxial growth process and a post epitaxial growth patterning process is used in providing the faceted surfaces to the second semiconductor material layer 14. When employed, the post epitaxial growth patterning process may include micromachining or a chemical wet etch process. In some embodiments, the second semiconductor material layer 14 is composed of a silicon germanium alloy with {311} or {111} faceted surfaces.

Figure 2:
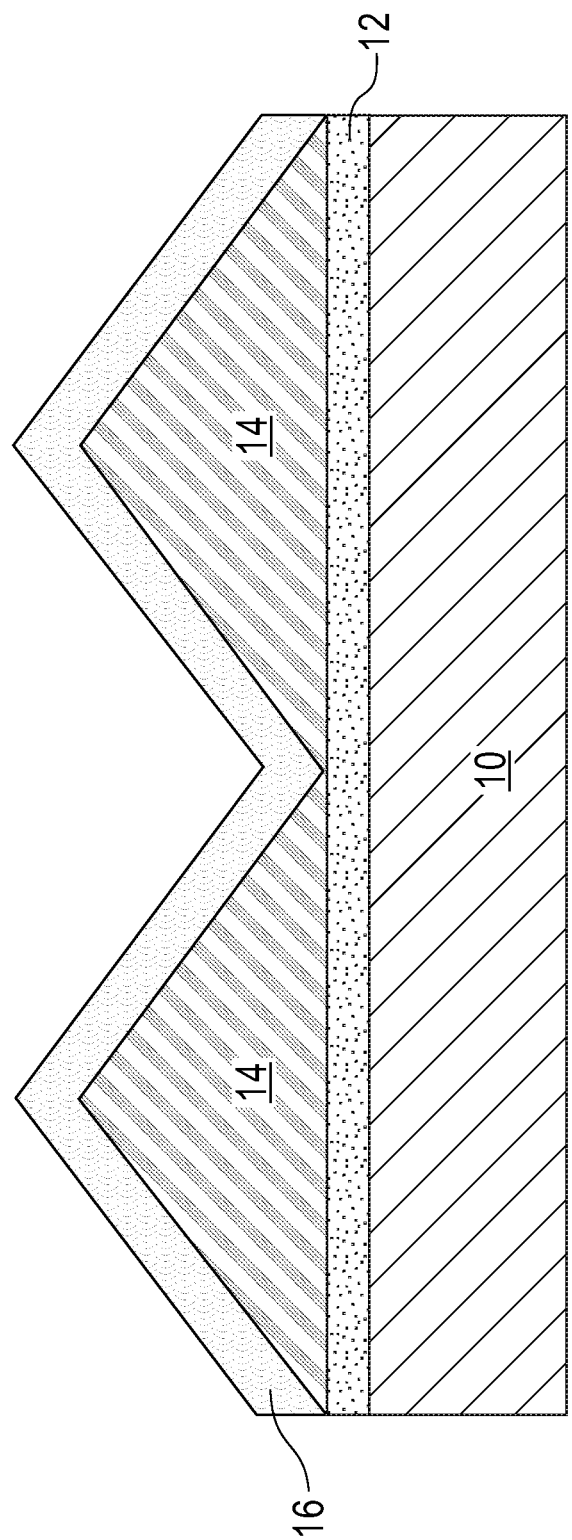
FIG. 2 is a cross sectional view of a portion of the exemplary semiconductor structure of FIG. 1A after forming a semiconductor channel material layer on the second semiconductor material layer.

Referring now to FIG. 2, there is illustrated a portion of the exemplary semiconductor structure of FIG. 1A after forming a semiconductor channel material layer 16 on the second semiconductor material layer 14. Although the present application describes and illustrates the formation of the semiconductor channel material layer 16 on the exemplary semiconductor structure shown in FIG. 1A, the semiconductor channel material layer 16 may be formed on the faceted surface of the second semiconductor material layer 14 of the exemplary semiconductor structure shown in FIG. 1B.

The semiconductor channel material layer 16 may include a single semiconductor material or a stack of semiconductor materials. The semiconductor channel material layer 16 may include one of semiconductor materials mentioned above for the bulk semiconductor substrate. The semiconductor channel material 16 may be entirely composed of a semiconductor material that has a different etch selectivity than the second semiconductor material layer 14. In one example, and when the second semiconductor layer 12 is composed of a silicon germanium alloy, the entirety of the semiconductor channel material layer 16 is composed of silicon. In some embodiments and when a stack of semiconductor materials is employed, at least one of the semiconductor materials of the stack has a different etch selectivity than the second semiconductor material layer 14, the other semiconductor materials that provide the stack may have a same etch selectivity as the second semiconductor material. In one example, and when the second semiconductor material layer 14 is composed of a silicon germanium alloy (hereinafter "SiGe" for short), the semiconductor channel material layer 16 may comprise a Si/SiGe/Si stack.

The semiconductor channel material layer 16 can be formed utilizing a deposition process including for example, an epitaxial growth process. The semiconductor channel material layer 16 may have a thickness from 0.5 nm to 10 nm, with a thickness of from 2 nm to 6 nm being more typically. The semiconductor channel material layer 16 follows the contour of the underlying second semiconductor material layer 14. Thus, the semiconductor channel material layer 16 has faceted surfaces and either a tip or mesa surface as shown in FIG. 1A or 1B.

Figure 3A:
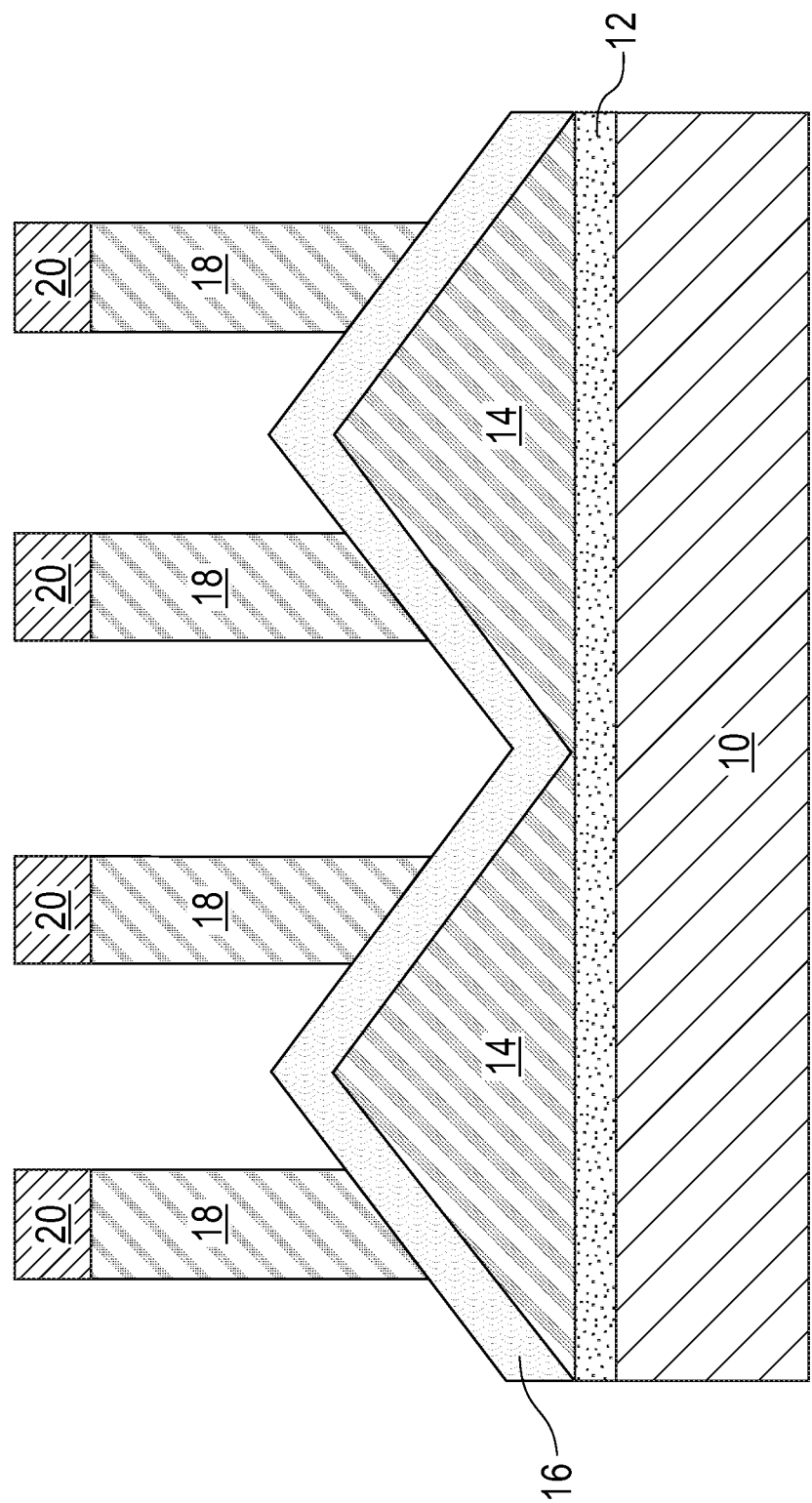
FIG. 3A is a cross sectional view of the exemplary semiconductor structure of FIG. 2 after forming a sacrificial gate structure on a sloped portion of the semiconductor channel material layer.
Figure 3B:
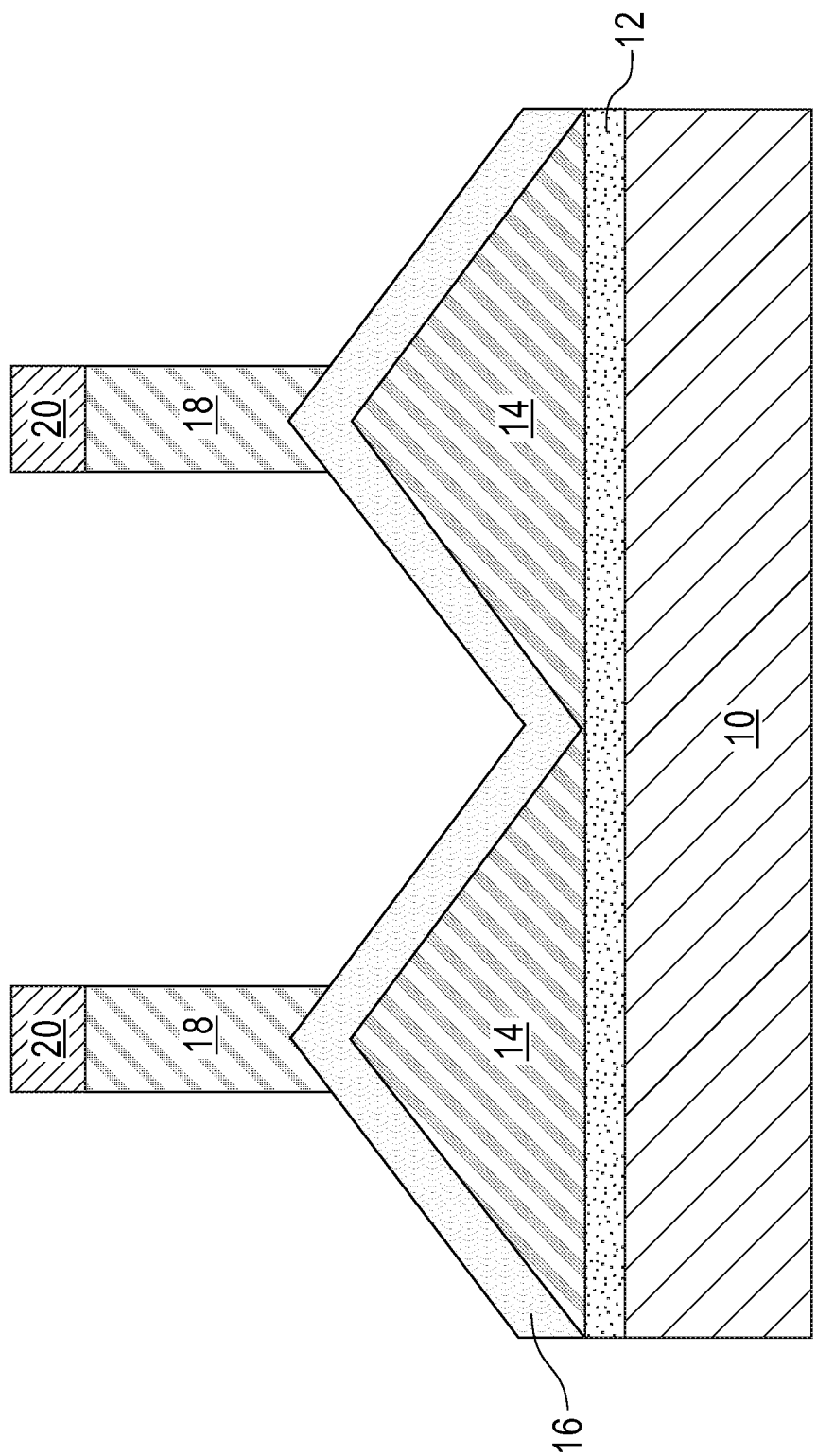
FIG. 3B is a cross sectional view of the exemplary semiconductor structure of FIG. 2 after forming a sacrificial gate structure on a tip portion of the semiconductor channel material layer.

Referring now to FIG. 3A, there is illustrated the exemplary semiconductor structure of FIG. 2 after forming a sacrificial gate structure (18, 20) on a sloped portion of the semiconductor channel material layer 16 in accordance with one embodiment of the present application; the sacrificial gate structure is employed in the present application as a placeholder material for a functional gate structure. The sloped portion of the semiconductor channel material layer 16 is located along the faceted surface of the second semiconductor material layer 14. FIG. 3B illustrates another embodiment in which a sacrificial gate structure (18, 20) is formed on a tip portion of the semiconductor channel material layer 16 of the exemplary semiconductor structure of FIG. 2; in this embodiment sacrificial gate structure extends onto a sloped portion of the semiconductor channel material layer 16. In each of the embodiments, a plurality of sacrificial gate structures is formed. While not shown, it is possible to form sacrificial gate structures on the sloped and tip or mesa portions of the semiconductor channel layer 16.

The sacrificial gate structure (18, 20) may include a single sacrificial material layer or a stack of two or more sacrificial materials (i.e., at least one sacrificial material portion). In one embodiment (not shown), the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. In the embodiment illustrated in FIG. 3A-3B, the sacrificial gate structure includes sacrificial gate portion 18 and a sacrificial dielectric cap portion 20. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the sacrificial gate structure (18, 20). The remaining portions of the sacrificial gate dielectric material constitute a sacrificial gate dielectric portion (not shown), the remaining portions of the sacrificial gate material constitute a sacrificial gate portion 18, and the remaining portions of the sacrificial dielectric cap material constitute a sacrificial dielectric cap portion 20.

Figure 4:
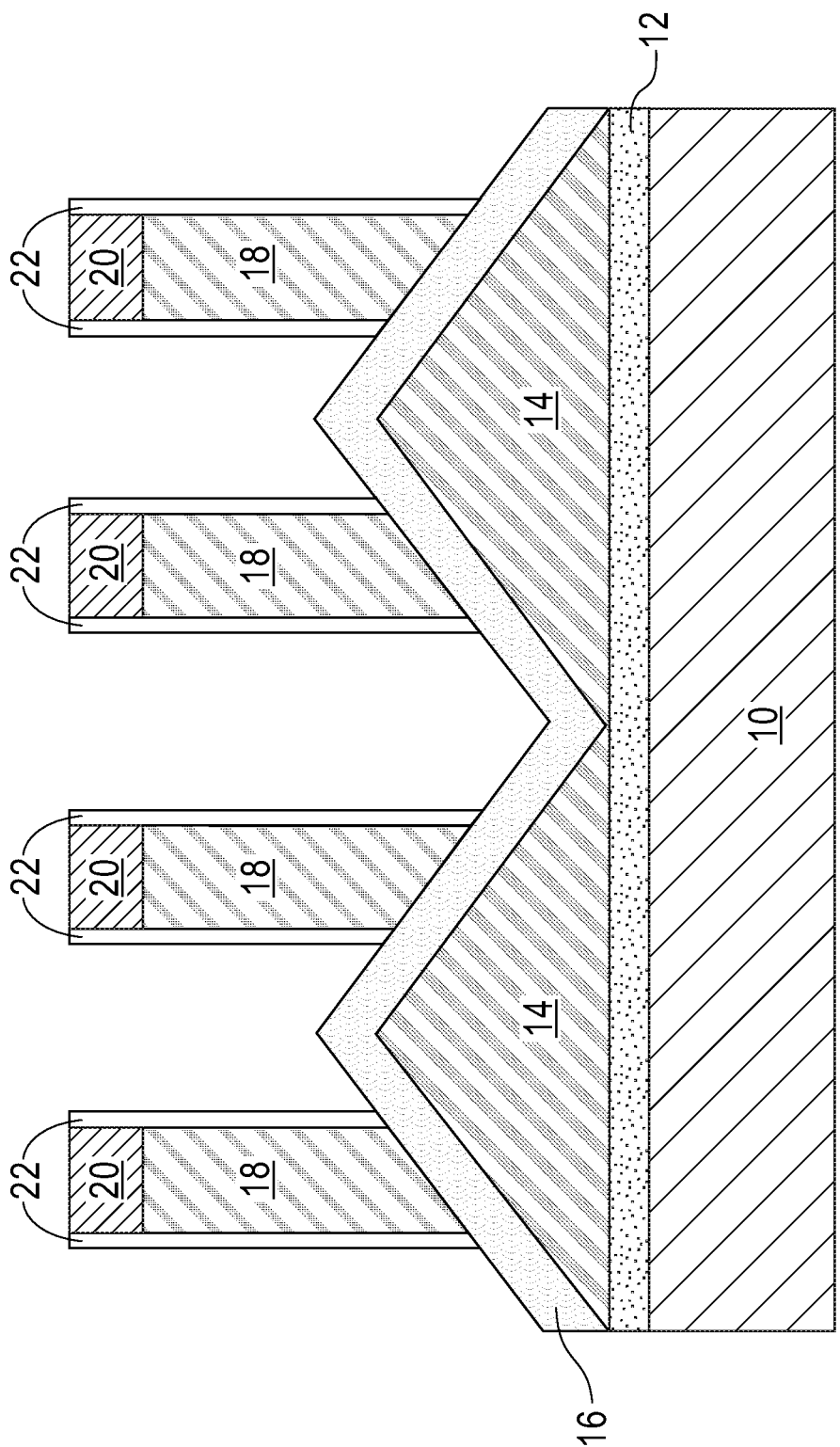
FIG. 4 is a cross sectional view of the exemplary semiconductor structure of FIG. 3A after forming a dielectric spacer on exposed sidewalls of the sacrificial gate structure.

Referring now to FIG. 4, there is illustrated the exemplary semiconductor structure of FIG. 3A after forming a dielectric spacer 22 on exposed sidewalls of the sacrificial gate structure (18, 20). The dielectric spacer 22 has a topmost surface that is coplanar with a topmost surface of the sacrificial gate structure (18, 20). Although the present application describes and illustrates the formation of the dielectric spacer 22 on the exposed sidewalls of the sacrificial gate structure (18, 20) of the exemplary semiconductor structure shown in FIG. 3A, the dielectric spacer 22 may be formed on the exposed sidewalls of the sacrificial gate structure (18, 20) of the exemplary semiconductor structure shown in FIG. 3B.

The dielectric spacer 22 is formed around the entire sidewalls of the sacrificial gate structure (18, 20). The dielectric spacer 22 can be formed by first providing a dielectric spacer material and then etching the dielectric spacer material. Examples of dielectric spacer materials that may be employed in the present application include dielectric oxides, dielectric nitrides and/or dielectric oxynitrides. Alternatively, the dielectric spacer material that provides the dielectric spacer 22 may be a dielectric material having a dielectric constant of less than silicon dioxide; a dielectric material having a dielectric constant of less than silicon dioxide can be referred to as a low k dielectric material. In one example, SiBCN may be used as a low k dielectric material that can provide the dielectric spacer 22. The dielectric spacer material may be provided by a deposition process including, for example, chemical vapor deposition (CVD), plasma enhanced chemical vapor deposition (PECVD), or physical vapor deposition (PVP). The etch used to provide the dielectric spacer 22 may comprise a dry etching process such as, for example, reactive ion etching.

Figure 5A:
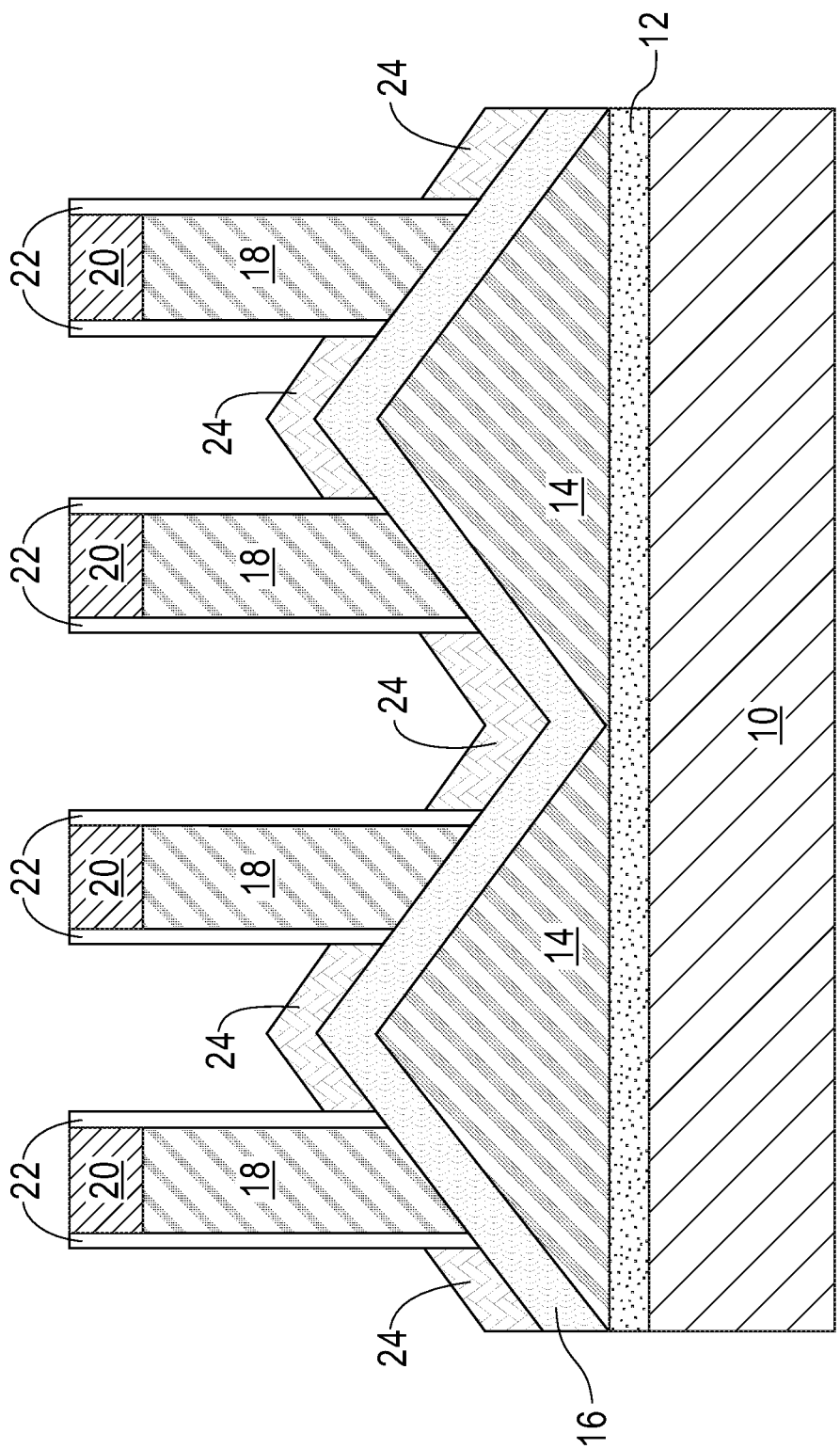
FIG. 5A is a cross sectional view of the exemplary semiconductor structure of FIG. 4 after forming a doped semiconductor material on portions of the semiconductor channel material layer not containing the dielectric spacer and the sacrificial gate structure.
Figure 5B:
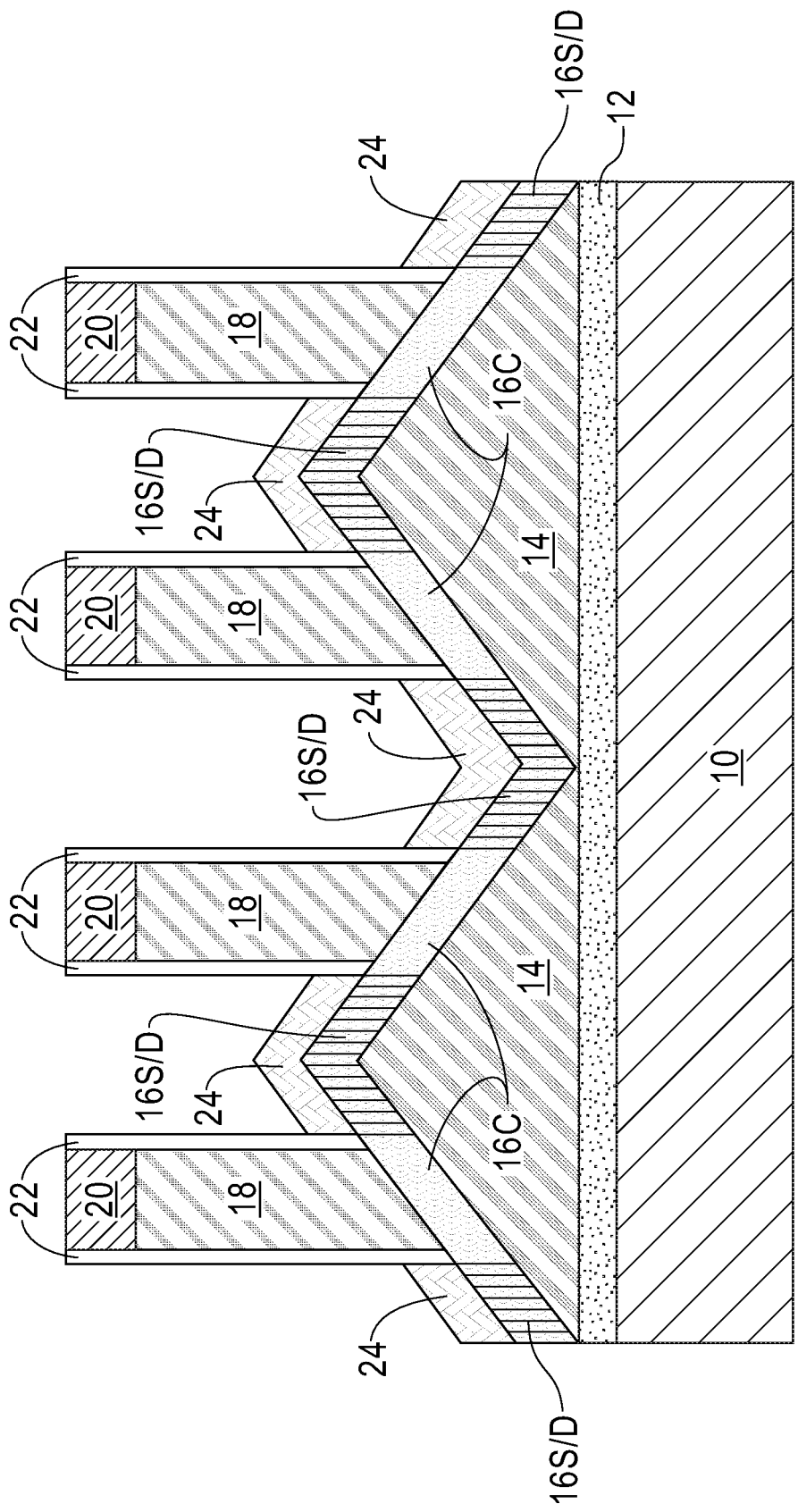
FIG. 5B is a cross sectional view of the exemplary semiconductor structure of FIG. 4 after introducing a dopant into portions of the semiconductor channel material layer not containing the dielectric spacer and the sacrificial gate structure, and forming a doped semiconductor material on the doped portions of the semiconductor channel material layer.
Figure 5C:
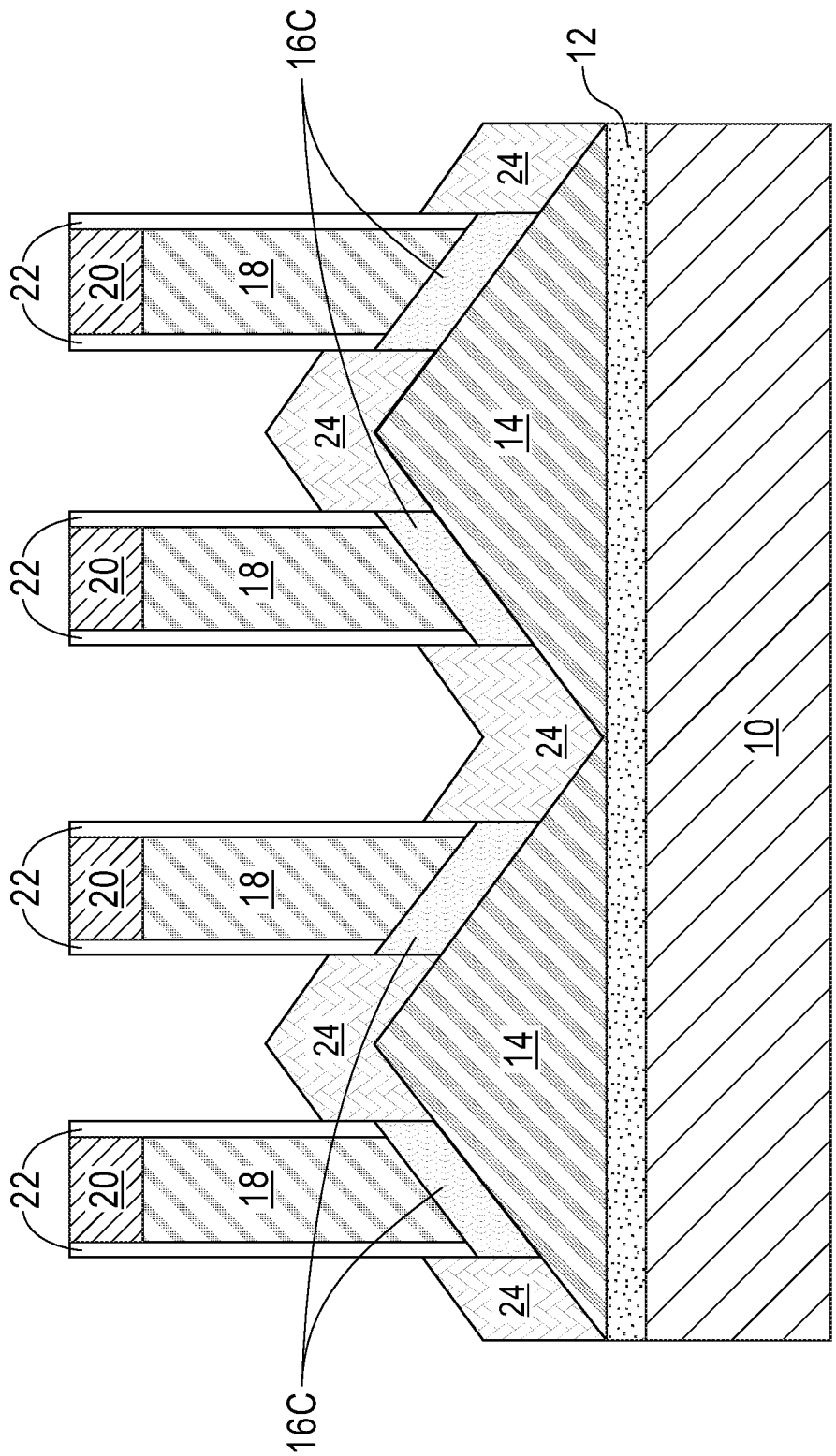
FIG. 5C is a cross sectional view of the exemplary semiconductor structure of FIG. 4 after removing exposed portions of the layer of semiconductor channel material not containing the dielectric spacer and the sacrificial gate structure, and forming a doped semiconductor material in each gap provided by the removal of the exposed portions of the layer of semiconductor channel material.

Referring now to FIGS. 5A-5C, there are illustrated the exemplary semiconductor structure of FIG. 4 after forming at least a doped semiconductor material 24. The doped semiconductor material 24 can be used in providing source/drain (S/D) structures. Notably, FIG. 5A illustrates the exemplary semiconductor structure of FIG. 4 after forming a doped semiconductor material 24 on portions of the semiconductor channel material layer 16 not containing the dielectric spacer 22 and the sacrificial gate structure (18, 20). In this embodiment, the doped semiconductor material 24 provides a raised portion of the S/D structure. Also, and in this embodiment, diffusion of dopants from the doped semiconductor material 24 into underlying portions of the semiconductor channel layer 16 may occur during a later performed thermal processing step of the present application, e.g., during the deposition of the gate dielectric material of the functional gate structure. The doped semiconductor material 24 includes one of the semiconductor materials mentioned above for the bulk semiconductor substrate 10 and includes an n-type dopant or p-type dopant as mentioned above. In one example, the doped semiconductor material 24 may include boron doped silicon germanium or phosphorus doped Si:C (i.e., carbon doped silicon). The doped semiconductor material 24 can be formed utilizing an epitaxial growth process as mentioned above.

FIG. 5B illustrates the exemplary semiconductor structure of FIG. 4 after introducing a dopant (n-type or p-type) into portions of the semiconductor channel material layer 16 not containing the dielectric spacer 22 and the sacrificial gate structure (18, 20), and forming a doped semiconductor material 24 on the doped portions of the semiconductor channel material layer 16. The doped semiconductor portions of the semiconductor channel material layer 16 may be referred to as a source/drain regions 16S/D, while the portion of the semiconductor channel material 16 that is presented beneath the dielectric spacer 22 and the sacrificial gate structure (18, 20) may be referred to herein as a semiconductor nanowire 16C; the semiconductor nanowire 16C provides a channel region for subsequently formed functional gate structure. The semiconductor nanowire 16C is tilted relative to the planar topmost surface of bulk semiconductor substrate 10. By "tilted" it is meant that the semiconductor nanowire is not oriented horizontally or vertically and has some slope associated therewith. In this embodiment, the tilted semiconductor nanowire 16C is located over a faceted surface of the underling second semiconductor material layer 14.

The dopants can be introduced into the portions of the semiconductor channel material layer 16 not containing the dielectric spacer 22 and the sacrificial gate structure (18, 20) by ion implantation or gas phase doping, and the doped semiconductor material 24 (which has a same conductivity dopant as the S/D structures 16S/D) can be formed utilizing an epitaxial growth process. In this embodiment illustrated in FIG. 5B, and the embodiment depicted in FIG. 5A, the doped semiconductor material 24 may provide raised S/D regions.

FIG. 5C illustrates the exemplary semiconductor structure of FIG. 4 after removing exposed portions of the semiconductor channel material layer 16 not containing the dielectric spacer 22 and the sacrificial gate structure (18, 20), and forming a doped semiconductor material 24 in each gap that is provided by this removal step. The removal may be performed utilizing an etch that is selective in removing the physically exposed portions of the semiconductor channel material layer 16. The etch stops on the faceted surface of the underlying second semiconductor material layer 14 and forms a gap. The doped semiconductor material 24 can be formed in the gap by an epitaxial growth process as mentioned above. In this embodiment, the lower portion of the doped semiconductor material 24 may function as a source/drain region, while the upper portion of the doped semiconductor material 24 may function as a raised source/drain region. In FIG. 5C, element 15C denotes a tilted semiconductor nanowire; the tilted semiconductor nanowire 16C provides a channel region for subsequently formed functional gate structure.

Figure 6:
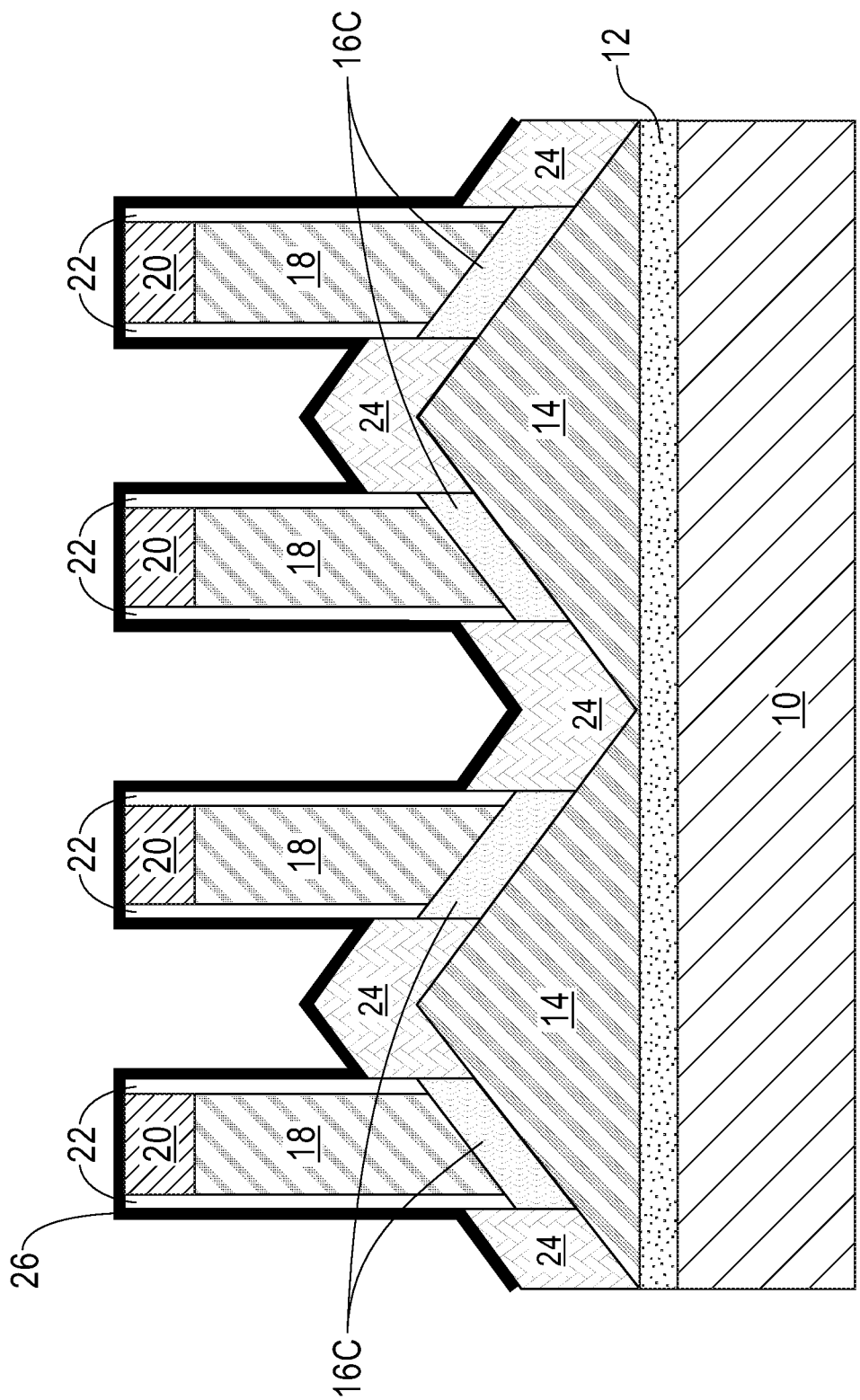
FIG. 6 is a cross sectional view of the exemplary semiconductor structure of FIG. 5C after forming a contact etch stop liner.

Referring now to FIG. 6, there is illustrated the exemplary semiconductor structure of FIG. 5C after forming a contact etch stop layer 26. Although the present application describes and illustrates the formation of the contact etch stop layer 26 on the exposed surfaces of the exemplary semiconductor structure shown in FIG. 5C, the contact etch stop layer 26 may be formed on the exposed surfaces of the exemplary semiconductor structure shown in FIG. 5A or 5B. The contact etch stop layer 26 is a continuous layer that is formed on all the physical exposed surfaces of the exemplary semiconductor structure shown in FIG. 5A, 5B or 5C.

The contact etch stop layer 26 comprises a dielectric material having a different etch selectivity than the dielectric spacer 22, and, if present, the sacrificial dielectric cap 20, and the interlevel dielectric (ILD) material 28 to be subsequently formed. In one example, the contact etch stop layer 26 is composed of silicon dioxide or silicon nitride. The contact etch stop layer 26 may be formed by a deposition process including, for example, chemical vapor deposition (CVD), plasma enhanced chemical vapor deposition (PECVD), or physical vapor deposition (PVD).

Figure 7:
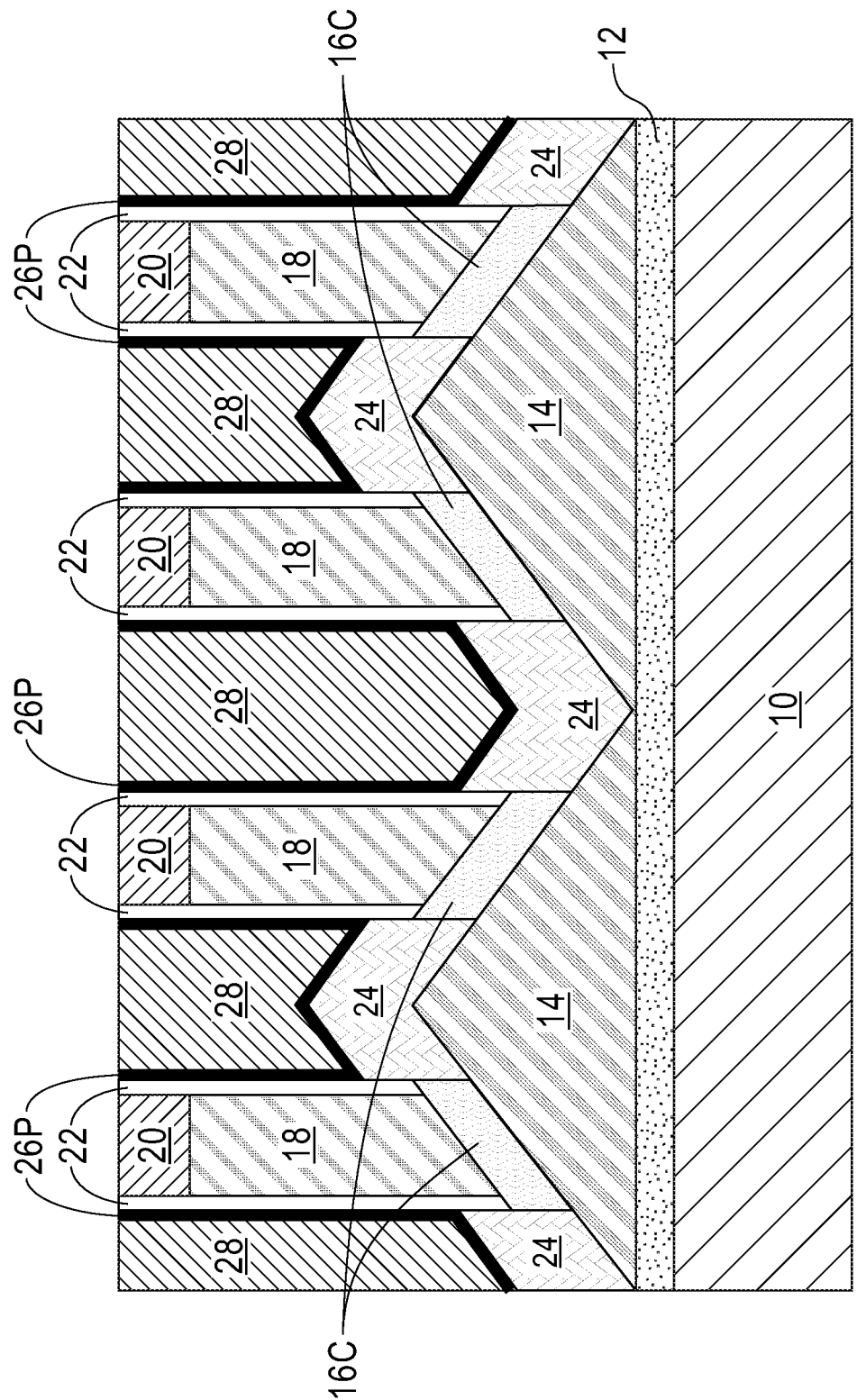
FIG. 7 is a cross sectional view of the exemplary semiconductor structure of FIG. 6 after forming an interlevel dielectric (ILD) material and planarizing to physically expose a topmost surface of the sacrificial gate structure.

Referring now to FIG. 7, there is illustrated the exemplary semiconductor structure of FIG. 6 after forming an interlevel dielectric (ILD) material 28, and planarizing to physically expose a topmost surface of the sacrificial gate structure (18, 20).

The ILD material 28 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 28. In one embodiment, the ILD material 28 can be formed utilizing a deposition process including, for example, chemical vapor deposition (CVD), plasma enhanced chemical vapor deposition (PECVD), evaporation or spin-on coating.

Following deposition of the ILD material 28, a planarization process such as chemical mechanical polishing is employed to as to expose a topmost surface of the sacrificial gate structure (18, 20). During the planarization, a portion of the contact etch stop layer 26 that is located above the scarification gate structure (18, 20) is removed. The remaining portion of the contact etch stop layer 26 may now be referred to as a contact etch stop liner 26P. In some embodiments, a portion of the ILD material 28 may also be removed during the planarization process.

Figure 8:
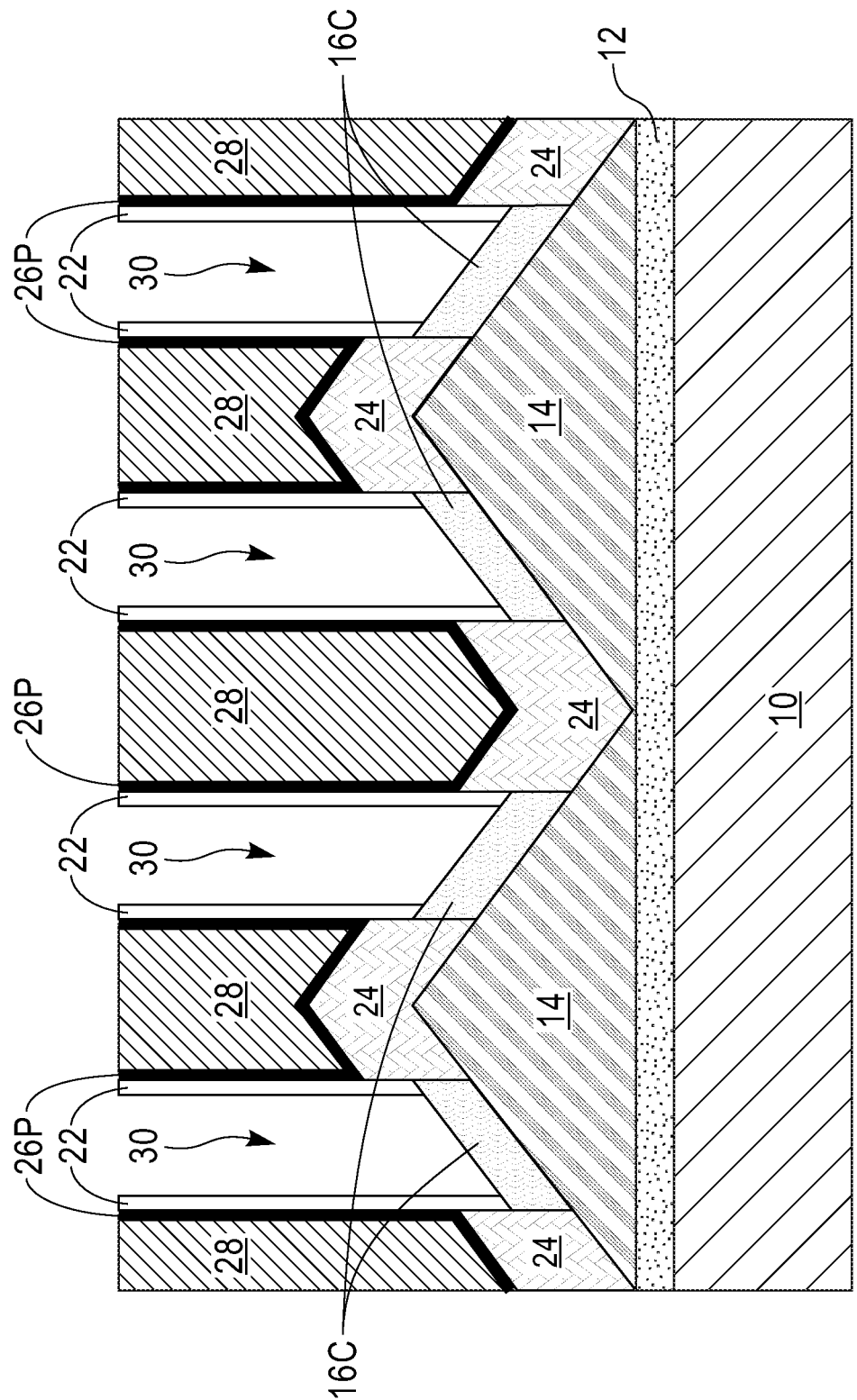
FIG. 8 is a cross sectional view of the exemplary semiconductor structure of FIG. 7 after removing the sacrificial gate structure to provide a gate cavity.

Referring now to FIG. 8, there is illustrated the exemplary semiconductor structure of FIG. 7 after removing the sacrificial gate structure (18, 20) to provide a gate cavity 30. The removal of the sacrificial gate structure (18, 20) can be performed utilizing one or more anisotropic etching processes that is selective in removing the material (or materials) that provide the sacrificial gate structure (18, 20). In this embodiment, the gate cavity 30 physically exposes a surface of the tilted semiconductor nanowire 16C.

Figure 9:
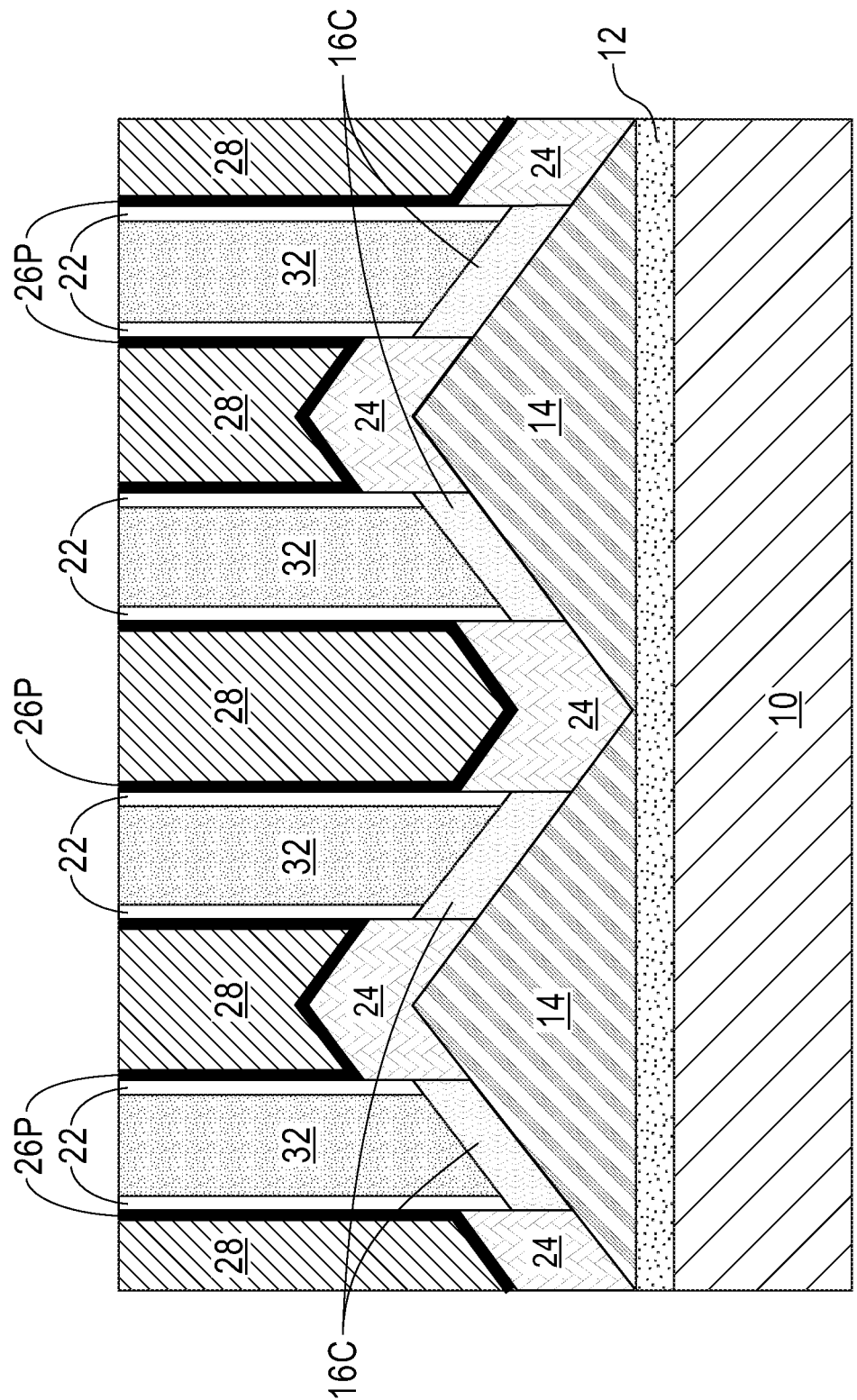
FIG. 9 is a cross sectional view of the exemplary semiconductor structure of FIG. 8 after forming a functional gate structure in the gate cavity.

Referring now to FIG. 9, there is illustrated the exemplary semiconductor structure of FIG. 8 after forming a functional gate structure 32 in the gate cavity 30. The term "functional gate structure" as used herein refers to a permanent gate structure used to control output current (i.e., flow of carriers in the channel) of a semiconducting device through electrical fields or magnetic fields. Each functional gate structure 32 may include a gate dielectric material portion (not separately shown) and a gate conductor material portion (also not separately). As is shown in FIG. 9, the functional gate structure 32 has a bottommost surface that is tilted; the tilt is in the same direction as the tilted semiconductor nanowire 16C.

As known to those skilled in the art, the gate dielectric material portion of a functional gate structure is located beneath the gate conductor material portion. In some embodiments, the gate dielectric material portion of the functional gate structure 32 is U-shaped. By "U-shaped" it is meant a material has a horizontal portion and two vertical portions that extend upwards from the ends of the horizontal portion. In such an embodiment, the gate conductor material portion is positioned atop the horizontal portion of the gate dielectric material portion and between the two vertical portions of the gate dielectric material portion. Also, and in such an embodiment, the topmost surface of each vertical portion of the gate dielectric material portion is coplanar with a topmost surface of the gate conductor material portion.

In the present application, and as illustrated in FIG. 9, the topmost surface of the functional gate structure 32 is coplanar with a topmost surface of each of the dielectric spacer 22, the contact etch stop liner 26P, and the ILD material 28.

The gate dielectric material portion of the functional gate structure 32 may be composed of a gate dielectric material such as, for example, an oxide, nitride, and/or oxynitride. In one example, the gate dielectric material portion can be composed of a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion. The gate dielectric material that provides the gate dielectric portion can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material that provides the gate dielectric portion can have a thickness in a range from 1 nm to 10 nm. Other thicknesses that are lesser than, or greater than, the aforementioned thickness range can also be employed for the gate dielectric material that provides gate dielectric portion.

In some embodiments and when multiple functional gate structures are formed, the gate dielectric material portion of each functional gate structure may be the same. In other embodiments and when multiple functional gate structures are formed, the gate dielectric material portion of a first set of functional gate structures may be composed of a first gate dielectric material, while a second set of functional gate structures may be composed of a second gate dielectric material that has a different composition than the first gate dielectric material.

The gate conductor portion of the functional gate structure 32 includes a gate conductor material. The gate conductor material used in providing the gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor material may comprise an nFET gate metal. In another embodiment, the gate conductor material may comprise a pFET gate metal. The gate conductor material used in providing the gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed.

In some embodiments and when multiple functional gate structures are formed, the gate conductor material portion of each functional gate structure may be the same. In other embodiments and when multiple functional gate structures are formed, the gate conductor material portion of a first set of functional gate structures may be composed of a first gate conductor material, while a second set of functional gate structures may be composed of a second gate conductor material that has a different composition than the first gate conductor material.

Figure 10:
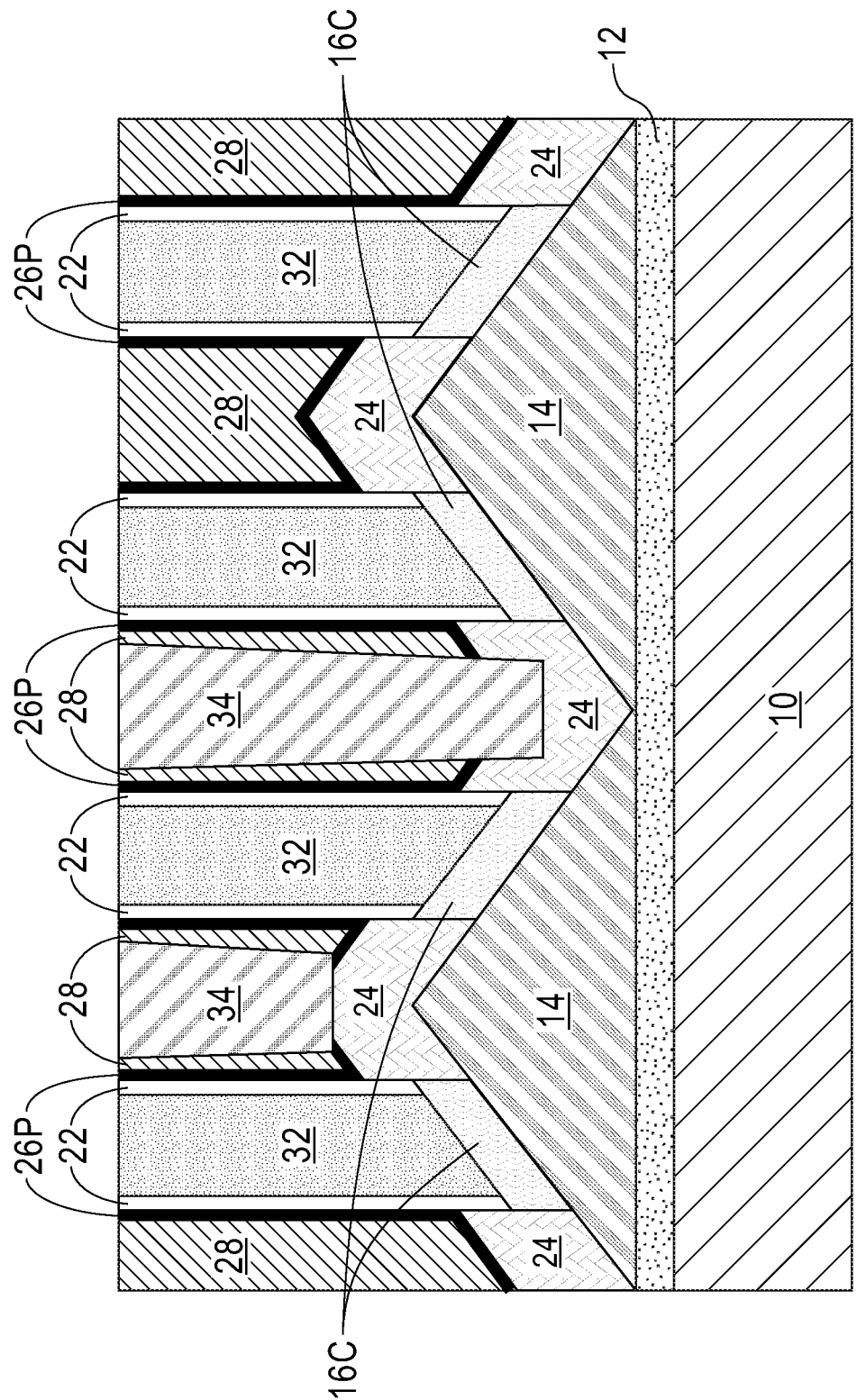
FIG. 10 is a cross sectional view of the exemplary semiconductor structure of FIG. 9 after forming contact structures in the interlevel dielectric (ILD) material.

Referring now to FIG. 10, there is illustrated the exemplary semiconductor structure of FIG. 9 after forming contact structures 34 in the interlevel dielectric (ILD) material 28. As illustrated, each contact structure 34 contacts a surface of doped semiconductor material 24. Each contact structure 34 can be formed by lithography and etching to provide a contact opening in the ILD material 28 that exposes a surface of doped semiconductor material 24 and then the contact opening is filled with at least one contact metal or metal alloy. The contact metal or metal alloy may include copper (Cu), tungsten (w), cobalt (Co) or alloys thereof. In some embodiments, a metal semiconductor alloy such as a metal silicide can be formed into each contact opening prior to filling the contact opening with a contact metal or metal alloy. In some embodiments, a planarization process may follow the fill of the contact openings with the contact metal or metal alloy.

FIGS. 9 and 10 illustrate an exemplary tilted nanowire structure of the present application. The structure includes a bulk semiconductor substrate 10 having an entirely planar topmost surface. A first semiconductor material layer 12 comprising a first semiconductor material is located on the entirely planar topmost surface of the bulk semiconductor substrate 10. A second semiconductor material layer 14 is located on the first semiconductor material layer 12, wherein the second semiconductor material layer 14 has a faceted surface, FS, and comprises a second semiconductor material having a different etch selectivity than the first semiconductor material. A tilted semiconductor nanowire 16C is located on a portion of the faceted surface, FS, of the second semiconductor material layer 14, and a functional gate structure 32 is located above the tilted semiconductor nanowire 16C. As is shown, source/drain structures (represents in the illustrated embodiment as merely 24) are present at opposing ends of the tilted semiconductor nanowire 16C.

Figure 11A:
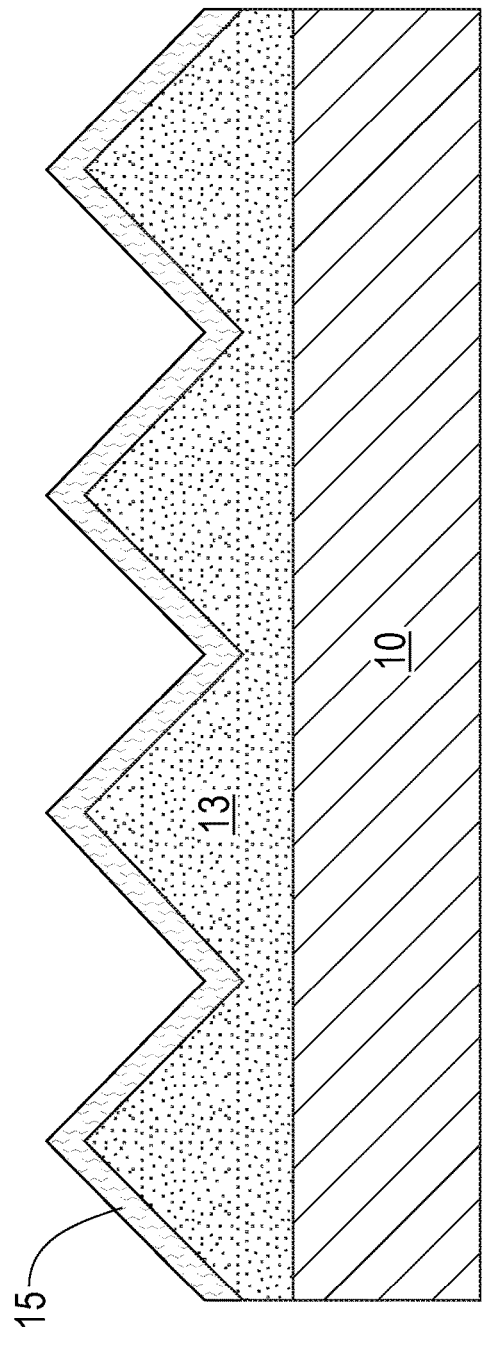
FIG. 11A is a cross sectional view of an exemplary semiconductor structure including a bulk semiconductor substrate, a first semiconductor material layer having a faceted surface, and a second semiconductor material layer that has a faceted surface and a different etch selectivity than the first semiconductor material layer that can be employed in accordance with another embodiment of the present application.
Figure 11B:
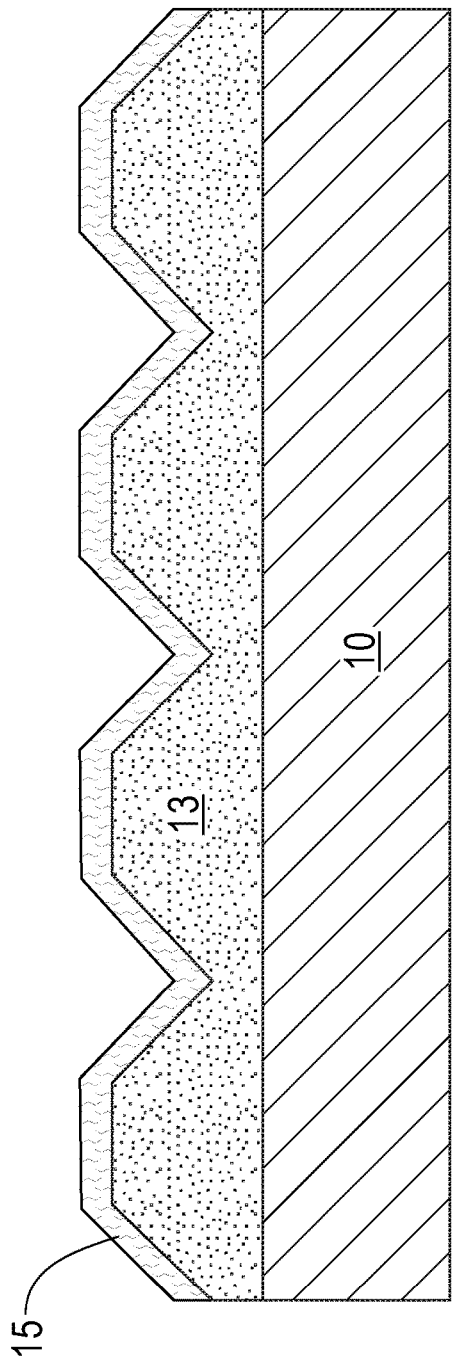
FIG. 11B is a cross sectional view of an exemplary semiconductor including a bulk semiconductor substrate, a first semiconductor material layer having a faceted surface, and a second semiconductor material layer that has a faceted surface and a different etch selectivity than the first semiconductor material layer that can be employed in accordance with another embodiment of the present application.

Referring now to FIGS. 11A-11B, there are shown an exemplary semiconductor structure that can be employed in another embodiment of the present application. The exemplary semiconductor structures of FIGS. 11A-11B include a bulk semiconductor substrate 10, a first semiconductor material layer 13 having a faceted surface, and a second semiconductor material layer 15 that has a faceted surface and a different etch selectivity than the first semiconductor material layer 13.

The bulk semiconductor substrate 10 of this embodiment of the present application in the same as the bulk semiconductor substrate 10 mentioned above for the embodiment illustrated in FIGS. 1A and 1B. In this embodiment, the first semiconductor material layer 13 is the same as the first semiconductor material layer 12 mentioned in the embodiment illustrated in FIGS. 1A-1B except that the first semiconductor material that provides the first semiconductor material layer 13 is faceted. The first semiconductor material layer 13 of this embodiment includes a semiconductor material which can be typically doped as defined above for the first semiconductor material layer 12. The first semiconductor material layer 13 of this embodiment can be formed utilizing the one of the techniques mentioned above for forming the second semiconductor material layer 14.

The second semiconductor material layer 15 of this embodiment comprises a semiconductor material which can be typically doped as defined above for the first semiconductor material layer 14. The second semiconductor material layer 15 of this embodiment can be formed utilizing a deposition process without any post deposition patterning step similar to the technique mentioned above in forming the semiconductor channel material layer 16.

Figure 12:
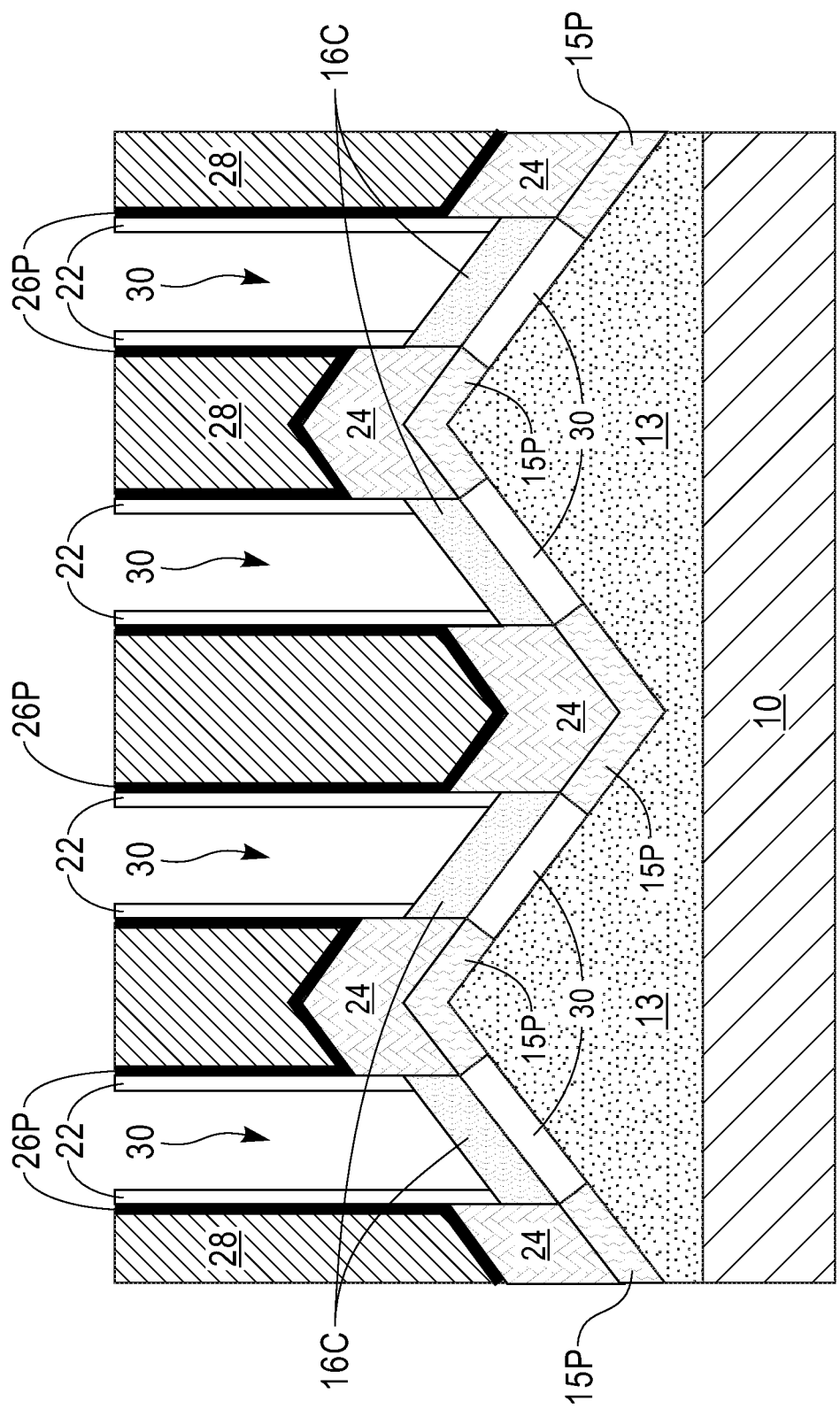
FIG. 12 is a cross sectional view of the exemplary semiconductor structure of FIG. 11A after performing the processing steps described in FIGS. 2, 3A, 4, 5C and 6-8, and removing the second semiconductor material layer beneath the channel region of the semiconductor channel material layer.

Referring now to FIG. 12, there is illustrated the exemplary semiconductor structure of FIG. 11A after performing the processing steps described in FIGS. 2, 3A, 4, 5C and 6-8, and removing the second semiconductor material layer 15 beneath the channel region of the semiconductor channel material layer (i.e., tilted semiconductor nanowire 16C). Alternatively, the processing illustrated in FIGS. 3B and/or 5A and 5B may also be employed. The removal of the second semiconductor material layer 15 beneath the tilted semiconductor nanowire 16C suspends the tilted semiconductor wire 16C (wherein the semiconductor material includes multiple semiconductor materials of a same type, a plurality of suspended semiconductor nanowires (not shown) can be formed). The removal of the second semiconductor material layer 15 beneath the tilted semiconductor nanowire 16C may be performed utilizing an etching process that is selective for removing the second semiconductor material that provides the second semiconductor material layer 15. In this embodiment, the tilted semiconductor nanowire 16C is suspended over a faceted surface of the underling first semiconductor material layer 13.

Figure 13:
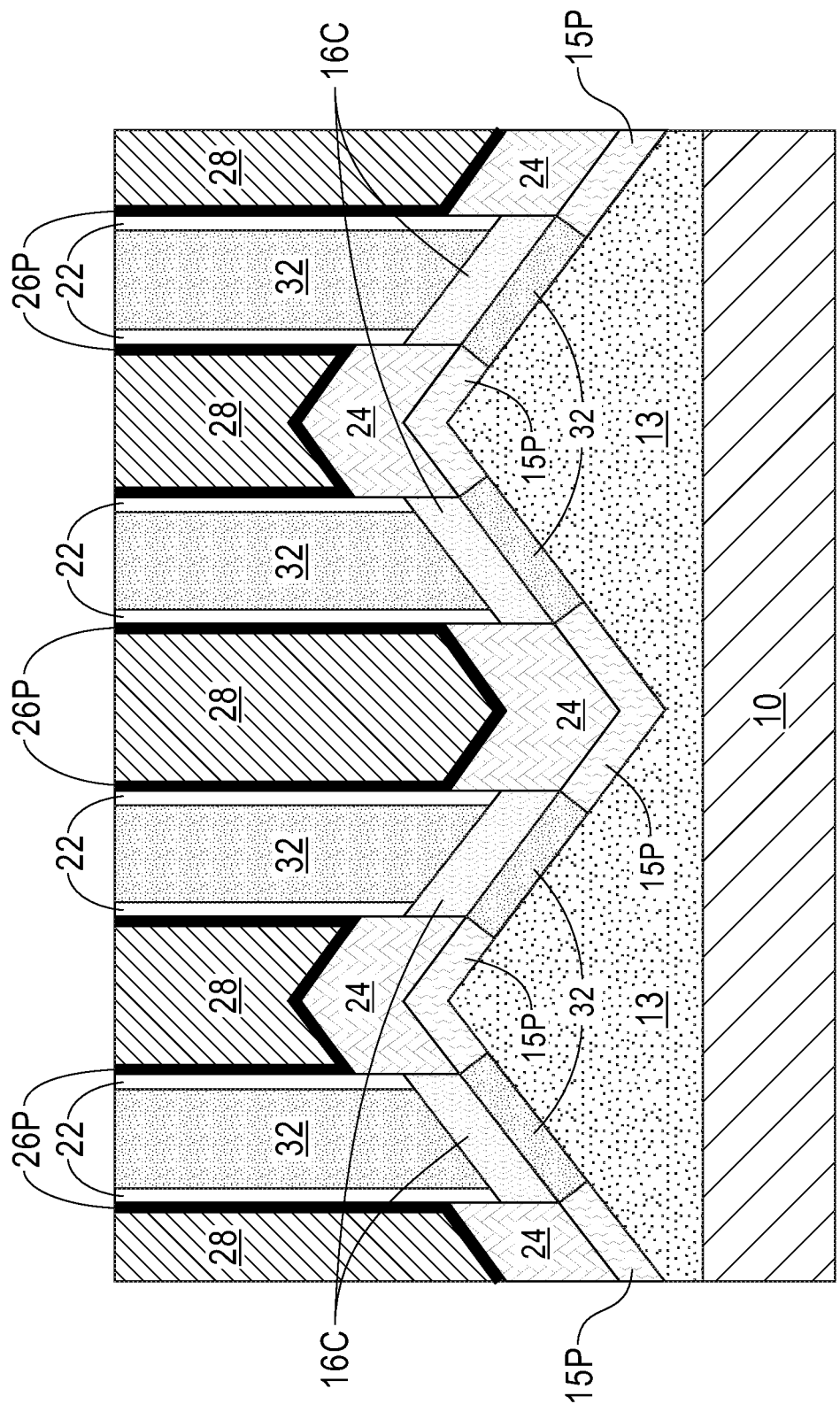
FIG. 13 is a cross sectional view of the exemplary semiconductor structure of FIG. 12 after forming a functional gate structure in the gate cavity.

Referring now to FIG. 13, there is illustrated the exemplary semiconductor structure of FIG. 12 after forming a functional gate structure 32 in the gate cavity 30. The functional gate structure 32 of this embodiment is the same as that mentioned in FIG. 9 of the present application.

Figure 14:
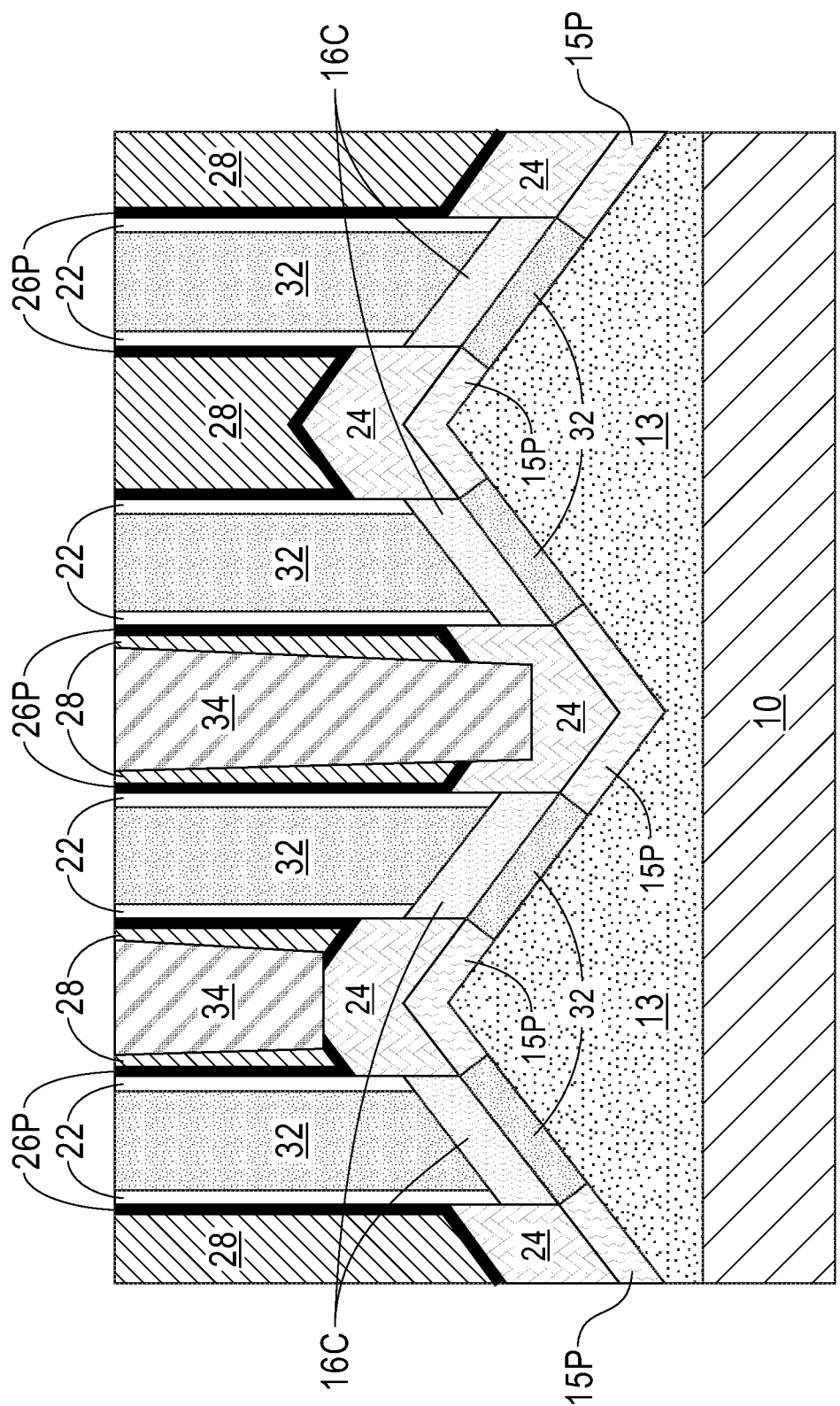
FIG. 14 is a cross sectional view of the exemplary semiconductor structure of FIG. 13 after forming contact structures in the interlevel dielectric (ILD) material.

Referring now to FIG. 14, there is illustrated the exemplary semiconductor structure of FIG. 13 after forming contact structures 34 in the interlevel dielectric (ILD) material 28. The contact structures 34 of this embodiment are the same as that mentioned in FIG. 10 of the present application.

FIGS. 13 and 14 illustrate another exemplary tilted nanowire structure of the present application. Notably, FIGS. 13 and 14 illustrate a semiconductor structure that includes a bulk semiconductor substrate 10 having an entirely planar topmost surface. A first semiconductor material layer 13 comprising a first semiconductor material and having a faceted surface, FS, is located on the entirely planar topmost surface of the bulk semiconductor substrate 10. A second semiconductor material layer (i.e., second semiconductor material portions 15P) is located on portions of the first semiconductor material layer 13, wherein the second semiconductor material layer (i.e., second semiconductor material portions 15P) comprises a second semiconductor material having a different etch selectivity than first semiconductor material. A tilted semiconductor nanowire 16C is suspended above a portion of the faceted surface, FS, of the first semiconductor material layer 13, and a functional gate structure 32 located above and beneath the tilted semiconductor nanowire. As is shown, source/drain structures (represents in the illustrated embodiment as merely 24) are present at opposing ends of the tilted semiconductor nanowire 16C.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
 a bulk semiconductor substrate having an entirely planar topmost surface;
 a first semiconductor material layer comprising a first semiconductor material and located on an entirety of the entirely planar topmost surface of the bulk semiconductor substrate;
 a second semiconductor material layer located on an entirety of the first semiconductor material layer, wherein the second semiconductor material layer has faceted surfaces and comprises a second semiconductor material having a different etch selectivity than the first semiconductor material;
 a tilted semiconductor nanowire in direct physical contact with a portion of each of the faceted surfaces of the second semiconductor material layer; and
 a functional gate structure located entirely above the tilted semiconductor nanowire.

2. The semiconductor structure of claim 1, further comprising a dielectric spacer located on sidewalls of the functional gate structure.

3. The semiconductor structure of claim 2, further comprising a contact etch stop liner located on the dielectric spacer.

4. The semiconductor structure of claim 1, further comprising a source/drain structure located at opposing ends of the tilted semiconductor nanowire.

5. The semiconductor structure of claim 4, wherein the source/drain structure comprises at least a raised doped semiconductor material.

6. The semiconductor structure of claim 1, wherein the second semiconductor material layer is pyramidal in shape and has a pointy top surface.

7. The semiconductor structure of claim 1, wherein the second semiconductor material layer is pyramidal in shape and has a mesa surface.

8. The semiconductor structure of claim 1, wherein the functional gate structure has a bottommost surface that is tilted.

9. The semiconductor structure of claim 1, wherein the first semiconductor material layer has an entirely planar topmost surface.

10. The semiconductor structure of claim 1, further comprising a source/drain structure located at opposing ends of the tilted semiconductor nanowire.

11. The semiconductor structure of claim 10, wherein the source/drain structure comprises at least a raised doped semiconductor material.

12. A semiconductor structure comprising:
 a bulk semiconductor substrate having an entirely planar topmost surface;
 a first semiconductor material layer comprising a first semiconductor material and located on an entirety of the entirely planar topmost surface of the bulk semiconductor substrate;
 a second semiconductor material layer located on an entirety of the first semiconductor material layer, wherein the second semiconductor material layer comprises a silicon germanium alloy having a faceted surface or a faceted surface;
 a tilted semiconductor nanowire in direct physical contact with a portion of each of the faceted surfaces of the second semiconductor material layer; and
 a functional gate structure located entirely above the tilted semiconductor nanowire.

13. The semiconductor structure of claim 12, further comprising a dielectric spacer located on sidewalls of the functional gate structure.

14. The semiconductor structure of claim 13, further comprising a contact etch stop liner located on the dielectric spacer.

* * * * *